United States Patent [19]

Kodera

[11] Patent Number: 5,131,546
[45] Date of Patent: Jul. 21, 1992

[54] SEMICONDUCTOR WAFER SUPPORT CARRIER

[75] Inventor: Masako Kodera, Matsudo, Japan

[73] Assignee: Kabushiki Kaisha Toshiba, Kawasaki, Japan

[21] Appl. No.: 594,308

[22] Filed: Oct. 9, 1990

[30] Foreign Application Priority Data

Oct. 9, 1989 [JP] Japan .................. 1-263440

[51] Int. Cl.⁵ .............................................. A47F 7/00
[52] U.S. Cl. ................................... 211/41; 118/500
[58] Field of Search .............. 211/40, 41; 118/500, 118/728, 729; 206/454

[56] References Cited

U.S. PATENT DOCUMENTS

| | | | |
|---|---|---|---|
| 3,534,862 | 10/1970 | Schambelan | 211/41 |
| 3,926,305 | 12/1975 | Wallestad | 211/41 X |
| 4,088,254 | 5/1978 | Hooper | 211/41 X |
| 4,653,650 | 3/1987 | Schulke | 211/41 |
| 4,669,612 | 6/1987 | Mortensen | 211/41 X |
| 4,841,906 | 6/1989 | deGeest | 118/500 |
| 4,949,848 | 8/1990 | Kos | 118/500 X |
| 5,011,041 | 4/1991 | Kakizaki | 118/500 X |
| 5,012,935 | 5/1991 | Aigo | 211/41 X |

Primary Examiner—Robert W. Gibson, Jr.
Attorney, Agent, or Firm—Foley & Lardner

[57] ABSTRACT

A semiconductor wafer support carrier used for supporting semiconductor wafers during a liquid phase process. The semiconductor wafer support carrier supports the semiconductor wafers when the semiconductor wafers are standing and spaced. The semiconductor wafer support carrier comprises a support frame supporting the semiconductor wafers, and dust protector plates arranged parallel to the semiconductor wafers. The dust protection plates are high enough that the upper ends thereof come out of the process liquid prior to the semiconductor wafers when the support frame is lifted out of the liquid.

4 Claims, 3 Drawing Sheets

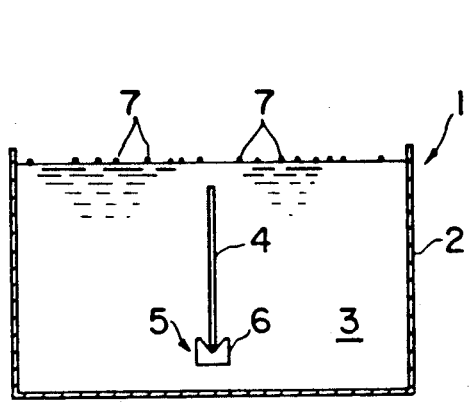
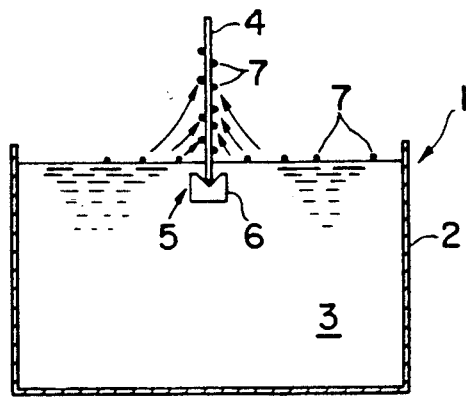
FIG. 9   FIG. 10
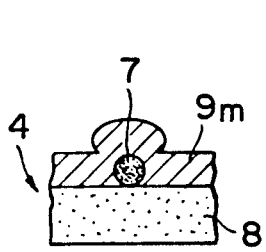
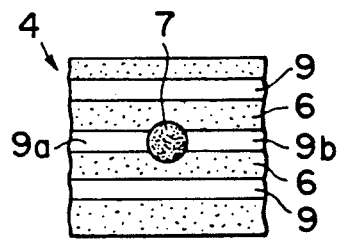
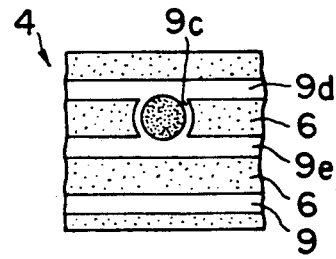
FIG. 11   FIG. 12   FIG. 13
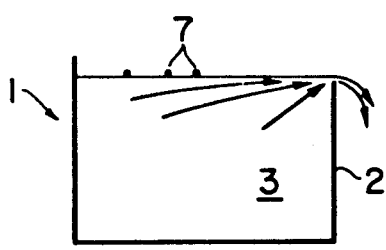
FIG. 14

SEMICONDUCTOR WAFER SUPPORT CARRIER

BACKGROUND OF THE INVENTION

The present invention relates to a semiconductor wafer support carrier used for supporting semiconductor wafers during liquid phase processes.

In semiconductor device manufacturing processes, semiconductor wafers undergo a variety of liquid phase processes. For example, semiconductor wafers undergo a washing process, which removes impurities from the surfaces of the semiconductor wafers. They then undergo an LPD process, which forms an $SiO_2$ film on the surfaces of the semiconductor wafers by a precipitation reaction in a supersaturated solution.

In these liquid phase processes, the semiconductor wafers are supported by the semiconductor wafer support carrier. The semiconductor wafer support carrier supporting the semiconductor wafers is placed in and out of the process liquid.

However, when the semiconductor wafer support carrier is withdrawn from the process liquid, it often happens that dust particles and the like in the process liquid adhere to the surfaces of the semiconductor wafers. In this case, minute pattern forming processes and the like thereafter are affected by this adhering dust.

FIGS. 9 and 10 show a conventional semiconductor wafer support carrier.

In FIGS. 9 and 10, a liquid phase process apparatus 1 is provided with a vessel 2 filled with process liquid 3. A conventional semiconductor wafer support carrier 5 is provided with a lower support stand 6 supporting the lower ends of semiconductor wafers 4. The semiconductor wafers 4 supported by the semiconductor wafer support carrier 5 are dipped in the process liquid 3 within the liquid phase process apparatus 1, during the liquid phase process. After that, the semiconductor wafers 4 are, with the semiconductor wafer support carrier 5, drawn out of the process liquid 3.

In general, the semiconductor wafer support carrier 5 supports a plurality of semiconductor wafers 4, for example, twenty five semiconductor wafers, depending on the manner in which the semiconductor wafers are spaced. Many dust particles 7 float on the surface of the process liquid 3.

When the semiconductor wafers 4 are drawn up out of the process liquid 3 by the semiconductor wafer support carrier 5 after the liquid phase process, the dust particles 7 on the surface of the process liquid 3 adhere to the surface of the semiconductor wafers 4.

For example, in semiconductor wafer washing process in which it is relatively easy to secure the cleanliness of the process liquid 3, the amount of dust particles adhering to the surfaces of the semiconductor wafer and having diameters of over 0.3 μm is in the order of several tens to several hundreds of particles per semiconductor wafer having a diameter of 5 inches (see FIG. 7).

On the other hand, in a resist exfoliation process or an LPD process, in which it is easy for dust particles to form, the amount of dust particles per semiconductor wafer is about 100~ about 1000 particles.

The dust particles adhering to the surface of the semiconductor wafer 4 cause a great deal of trouble in the minute pattern forming processes of the semiconductor wafers thereafter.

These phenomena are shown in FIG. 11~13.

FIG. 11 shows the sectional side view of the semiconductor wafer. In FIG. 11, a numeral reference 8 is a substrate of the semiconductor wafer. Dust particles 7 adhere to the surface of the substrate 8 during the liquid phase process of the semiconductor wafer. After that, a wiring material 9m is laminated on the surface of the substrate 8.

Next, certain shapes of wiring portions 9 are formed on the substrate 8 by etching the wiring material 9m of FIG. 11 (see FIGS. 12 and 13). FIGS. 12 and 13 show the top views of the semiconductor wafer.

However, it happens that the wiring portions 9 are separated by the dust particles 7, as shown in FIG. 12, when the wiring material 9m of FIG. 11 is etched. In this case, the wiring portions 9a and 9b, which should be properly connected, are separated by the dust particles 7, so that the wiring pattern formation of the semiconductor wafer becomes worse.

It also happens that the etching rest portion 9c remains under the dust particle 7 as shown in FIG. 13, when the dust particle 7 is positioned between the wiring portions 9 and the wiring material 9m of FIG. 11 is etched. In this case, the wiring portions 9d and 9e which should not normally be connected, are connected to each other through the etching resist portion 9c, so that the wiring pattern formation of the semiconductor wafer deteriorates further.

The method where the amount of the dust particles floating on the surface of the process liquid is reduced, has been employed in order to prevent the dust particles from adhering to the surfaces of semiconductor wafers.

That is, the method where the dust particles 7 are discharged with the process liquid 3 overflowing by supplying the process liquid 3 to the bottom portion of the vessel 2 has been employed.

The amount of dust particles 7 of the process liquid is decreased to some degree by the method as mentioned above, but the result of the method is not so apparent. This is because the dust particles 7 under the surface of the process liquid are discharged, but almost all the dust particles on the surface of the process liquid remain as shown in FIG. 14.

Thus, it is difficult to reduce the amount of dust particles in the process liquid 3. In the conventional liquid process, when the semiconductor wafer support carrier is drawn up out of the process liquid, the dust particles 7 of the process liquid 3 adhere to the surfaces of the semiconductor wafers 4, so that the minute pattern forming processes thereafter are affected by the adhering dust particles.

On the other hand, when the semiconductor wafer support carrier 5 supporting, for example, twenty five semiconductor wafers in a manner where the semiconductor wafers are standing and spaced in the longitudinal direction, is drawn up after the liquid phase process, many dust particles 7 adhere to the surfaces of the first semiconductor wafer (see FIGS. 7 and 8). However, the amount of the dust particles 7 adhering to the surfaces of the semiconductor wafers after the first (for example, the second, the third .... semiconductor wafers) is not as great.

This seems to be because dust particles floating before the first semiconductor wafer are easily drawn to the surfaces of the first semiconductor wafer, and because dust particles floating before the second or the third ... semiconductor wafers are prevented from approaching the surfaces of the corresponding semiconductor wafers by the front semiconductor wafers.

SUMMARY OF THE INVENTION

It is an object of the present invention to provide a semiconductor wafer support carrier which prevents dust particles from adhering to the surfaces of semiconductor wafers when the semiconductor wafers are drawn out of a process liquid. Collecting the dust particles somewhere other than on the semiconductor wafers is more useful and effective than discharging the dust particles, in order to prevent the dust particles from adhering to the semiconductor wafer.

The foregoing object is accomplished by providing a semiconductor wafer support carrier used for supporting semiconductor wafers in a manner where the semiconductor wafers are standing and spaced with regard to each other during a liquid phase process, with a process liquid, comprising; supporting means for supporting the semiconductor wafers, and dust protecting means for protecting the surfaces of the semiconductor wafers from dust particles, arranged parallel to the semiconductor wafers, the dust protecting means being so high that their upper ends come out of the process liquid prior to the semiconductor wafers, when the supporting means is drawn up.

In this invention, the upper ends of the dust protecting means come out of the process liquid ahead of the semiconductor wafers, when the supporting means are drawn up. Dust particles floating around the dust protecting means are drawn to and adhere to it.

The preferred embodiments of the present invention will become understood from the following detailed description, referring to the accompanying drawings.

BRIEF DESCRIPTION OF THE DRAWINGS

FIGS. 9 and 10 are side views showing a conventional semiconductor wafer support carrier;

FIG. 11 is a sectional side view showing a semiconductor wafer having dust particles collected inside of the wiring material;

FIGS. 12 and 13 are plan views showing the semiconductor wafer with dust particles inside of the wiring material.

FIG. 14 is a side view showing the flow of the dust particles in the process liquid.

DETAILED DESCRIPTION OF THE PREFERRED EMBODIMENTS

Figure 1:
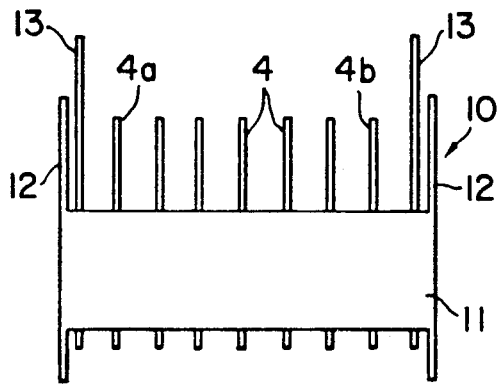
FIG. 1 is a side view showing first embodiment of a semiconductor wafer support carrier according to the present invention.

A first embodiment of a semiconductor wafer support carrier of the present invention will become understood from the following detailed description, with reference to FIG. 1.

As shown in FIG. 1, the semiconductor wafer support carrier 10 is provided with a support frame 11 which supports the sides of a plurality of semiconductor wafers 4 in a manner where the semiconductor wafers are spaced in the longitudinal direction. A pair of walls 12 are provided on both ends of the support frame 11. Thus, the semiconductor wafers 4 are contained, while being spaced within the support frame 11, and are conveyed with the support frame 11.

A pair of dust protection plates 13 are secured to the front and rear end portions of the support frame 11, respectively. The dust protection plate 13 of the front end portion is positioned in from to the first semiconductor wafer 4a, while the dust protection plate 13 of the rear end portion is positioned to the rear of the last semiconductor wafer 4b (the twenty fifth semiconductor wafer 4b when one lot consists of twenty fifth semiconductor wafers).

The height of each dust protection plate 13 is so great that the upper end of the dust protection plate 13 projects above the upper ends of the semiconductor wafers 4 contained within the support frame 11. Thus, the upper ends of the dust protection plates 13 come out of process liquid 3 prior to the semiconductor wafers 4, when the support frame 11 is drawn up from the process liquid with the semiconductor wafers 4.

The operation of the semiconductor wafer support carrier according to the first embodiment is as follows.

First, a plurality of semiconductor wafers 4, for example, twenty five semiconductor wafers 4 contained within the semiconductor wafer support carrier 10, are dipped in the process liquid 3 within a vessel 2 (FIG. 9). In this way, the semiconductor wafers 4 undergo a variety of liquid phase processes. For example, they undergo a washing process which removes impurities from this surfaces, and they undergo an LPD process which forms an $SiO_2$ film on their surfaces by a precipitation reaction in a supersaturated solution.

The semiconductor wafers 4 are then drawn up with the semiconductor wafer support carrier 10, after finishing the liquid phase processing.

Figure 7:
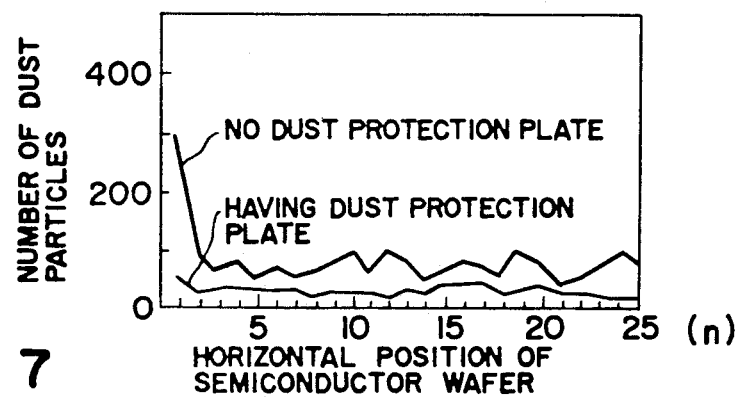
FIGS. 7 and 8 are graphs showing the experimental results of the present invention.
Figure 8:
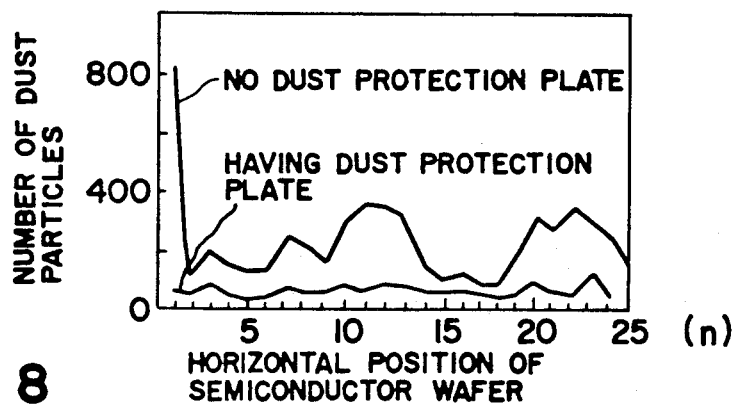

In this case, many dust particles in the process liquid adhere to the surfaces of the first semiconductor wafer 4a contained within a conventional semiconductor wafer support carrier (in FIGS. 7 and 8).

However in the semiconductor wafer support carrier according to the present invention, the dust protection plates 13 are positioned in front of the first semiconductor wafer 4a and to rear of the last semiconductor wafer 4b, and the upper ends of the dust protection plates 13 come out of the process liquid 3 prior to the semiconductor wafers 4, so that the dust particles floating around the dust protection plates 13 are drawn to and adhere to the surfaces of the dust protection plates 13. Therefore, the number of dust particles adhering to the surfaces of the semiconductor wafers 4 is reduced drastically.

Figure 2:
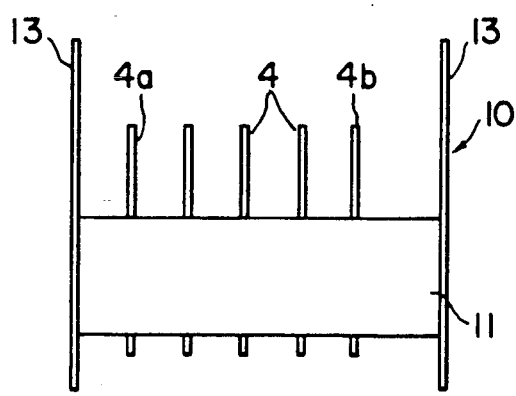
FIG. 2 is a side view showing another embodiment of the semiconductor wafer support carrier of FIG. 1.

FIG. 2 shows another embodiment of the semiconductor, wafer support carrier. The walls 12 of the semiconductor wafer support carrier 10 are removed, and the dust protection plates 13 serve as walls 12.

In this embodiment, the number of dust particles adhering to the surfaces of the first semiconductor wafer 4a is reduced, and is the same as in FIG. 1.

Figure 3:
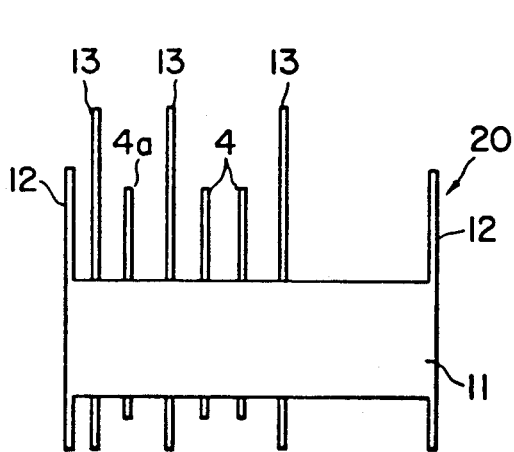
FIG. 3 is a side view showing a second embodiment of the semiconductor wafer support carrier.

Next, a third embodiment of the semiconductor wafer support carrier of the present invention is shown in FIG. 3.

In FIG. 3, a semiconductor wafer support carrier 20 is provided with a plurality of dust protection plates 13 which are mounted detachably on the support frame 11. One or a plurality of semiconductor wafers 4 are arranged between every two adjacent dust protection plates 13.

In this embodiment, the number of dust particles adhering to the surfaces of not only the semiconductor wafers 4 but also the first semiconductor wafer 4a is reduced. Therefore, the dust collection effect of the dust protection plates 13 is further improved, and the number of the dust particles adhering to the surfaces of the semiconductor wafers 4 is reduced by arranging the dust protection plates 13 at close intervals to each other within the support frame 11.

Figure 4:
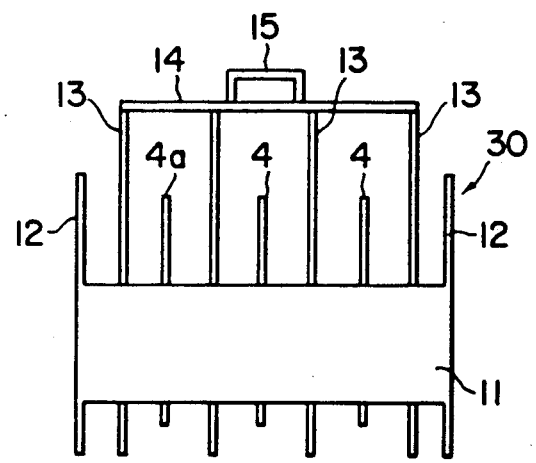
FIG. 4 is a side view showing a third embodiment of the semiconductor wafer support carrier.

Next, a fourth embodiment of the semiconductor wafer support carrier of the present invention is shown in FIG. 4.

In FIG. 4, a semiconductor wafer support carrier 30 is provided with a plurality of dust protection plates 13, which are arranged at close intervals within the support frame 11. The semiconductor wafers 4 are positioned between the dust protection plates 13, and the upper ends of the dust protection plates 13 are connected by a connection plate 14. A handle 15 is secured to the connection plate 14.

In this embodiment, the dust protection plates 13 are removed together from the support frame 11 by pulling up the connection plate 14, when the semiconductor wafers 4 are taken in and out of the semiconductor wafer support carrier 30. Therefore, it is easy to take the semiconductor wafers 4 in and out of the semiconductor wafer support carrier 30, and it is easy to remove the dust protection plate 13 from the support frame 11 because of the handle 15.

Figure 5:
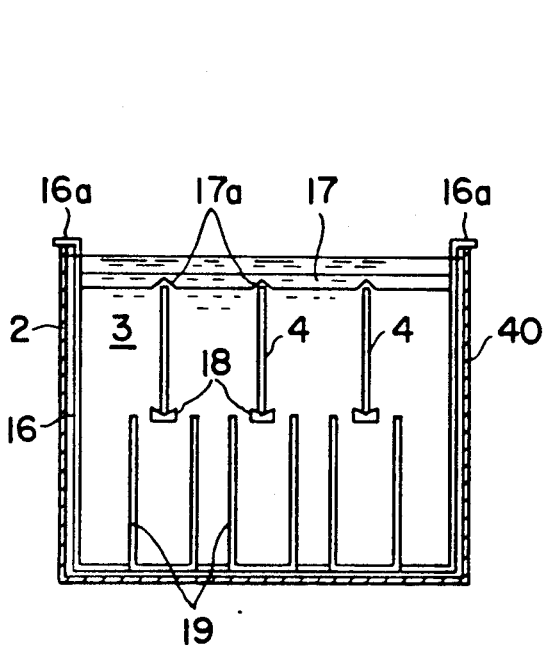
FIGS. 5 and 6 are side views showing a fourth embodiment of the semiconductor wafer support carrier.
Figure 6:
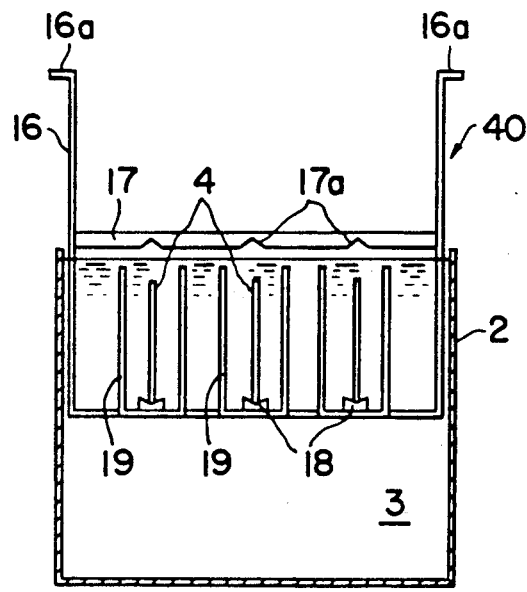

Next, a fifth embodiment of the semiconductor wafer support carrier of the present invention is shown in FIGS. 5 and 6.

In FIGS. 5 and 6, a semiconductor wafer support carrier 40 is provided with a frame body 16 having projecting portions 16a, at the upper ends thereof. An upper support bar 17 supports the upper ends of the semiconductor wafers 4, and lower support stands 18 support the bottoms of the semiconductor wafers 4. The upper support bar 17 has a plurality of support portions 17a, and is slidably connected to the vertical portions of the frame body 16. The lower support stands 18 are stopped by stoppers (not shown) of the vessel 2.

The frame body 16 is provided with a plurality of dust protection plates 19 at the bottom portion thereof. The dust protection plates 19 have a U-shaped section and are open in the upward direction. The dust protection plates 19 cover the bottom portions and both side portions of the semiconductor wafers 4. The height of each dust protection plates 19 is higher than that of the semiconductor wafers 4, so that the upper end of the dust protection plate 19 comes out of the process liquid 3 prior to the semiconductor wafers 4 when the semiconductor wafer support carrier 40 is drawn up from the process liquid 3.

As shown in FIG. 5, when the semiconductor wafers 4 are dipped in the process liquid 3 within the vessel 2, the upper ends of the semiconductor wafers 4 are supported by the support portions 17a, while the dust protection plates 19 remain at the bottom of the vessel 2.

When the semiconductor wafer support carrier is drawn up, the frame body 16 and the dust protection plate 19 are drawn up by pulling up the projecting portions 16a until the bottom portions of the dust protection plates 19 contact the lower support stands 18. During this time, the upper ends of the semiconductor wafers 4 are supported by the support portion 17a of the upper support bar 17 which slides on the vertical portions of the frame body 16. When the bottom portions of the dust protection plates 19 contact the lower support stands 18, support of the semiconductor wafers 4 by the support portion 17a is released, and semiconductor wafers 4 are supported only by the lower support stands 18 (FIG. 6). In this situation, when the semiconductor wafer support carrier 40 is further drawn up, the upper ends of the dust protection plates 19 come out of the process liquid 3 prior to the semiconductor wafers 4.

That is to say, the dust protection plates 19 remain at the bottom of the vessel 2 during the liquid phase processes. After finishing the liquid phase processes, the semiconductor wafers 4 are drawn up in a manner where the semiconductor wafers 4 are surrounded with the dust protection plates 19.

Therefore, the dust collection effect is improved by the dust protection plates 19 surrounding the semiconductor wafers 4. Liquid phase processes are not affected by the dust protection plates 19, because the dust protection plates 19 remain at the bottom of the vessel 2 during the liquid phase processes.

Next, the results of the dust effect experiments where the fourth embodiment of the semiconductor wafer support carrier, shown in FIG. 4, is compared with the conventional semiconductor wafer support carrier lacking the dust protection plates, are shown in FIGS. 7 and 8. In this case, each semiconductor wafer carrier contained twenty five semiconductor wafers arranged in the longitudinal direction and having a diameter of 5 inches, and the amount of dust particles which adhere to the surfaces of each semiconductor wafer and which had a diameter of over 0.3 $\mu$m was measured.

In FIGS. 7 and 8, the horizontal position of the semiconductor wafer within the semiconductor wafer support carrier is shown on the horizontal axis, and the number of dust particles is shown on the vertical axis. Each first semiconductor wafer is positioned at the first position on the horizontal axis.

FIG. 7 shows the first experimental result, where the semiconductor wafer washing process which removes impurities from the surfaces of the semiconductor wafers, is carried out as the liquid phase process.

As is clear is FIG. 7, the number of dust particles is reduced in the case of a semiconductor wafer support carrier having the dust protection plates 13 according to the present invention, as compared with in the case of the conventional semiconductor wafer support carrier. For example the maximum number of 300 is reduced to about 20.

FIG. 8 shows the second experimental result, where the LPD process, which forms an $SiO_2$ film on the surface of the semiconductor wafers by the precipitating reaction of the supersaturated solution, is carried out as the liquid phase process.

As is clear in FIG. 10, the number of dust particles is reduced in the case of a semiconductor wafer support carrier having the dust protection plates 13, as compared with in the case of the conventional semiconductor wafer support carrier. For example, several hundreds of particles are reduced to several tens.

What is claimed is:

1. A semiconductor wafer support carrier used for supporting semiconductor wafers in a manner where the semiconductor wafers are standing and spaced during a liquid phase process, comprising;
    supporting means for supporting the semiconductor wafers, and dust protecting means arranged parallel to the semiconductor wafers for protecting the surfaces of the semiconductor wafers from adhering dust particles, the dust protecting means being high enough that the upper ends of the dust protecting means come out of the process liquid before the semiconductor wafers when the supporting means is drawn up, wherein the supporting means is a support frame which supports and surrounds the sides of the semiconductor wafers, the dust protecting means consisting of dust protection plates mounted on the support frame, and the upper end of the support frame is lower than the upper ends of the dust protection plates.

2. The semiconductor wafer support carrier as claimed in claim 1, wherein the dust protection plates are mounted to at least the end portions of the support frame.

3. The semiconductor wafer support carrier as claimed in claim 2, wherein the upper ends of the dust protection plate are connected by a connection plate.

4. A semiconductor wafer support carrier used for supporting semiconductor wafers in a manner where the semiconductor wafers are standing and spaced during a liquid phase process, comprising:

supporting means for supporting the semiconductor wafers, and dust protecting means arranged parallel to the semiconductor wafers, for protecting the surfaces of the semiconductor wafers from dust particles, the dust protecting means being high enough that the upper ends of the dust protecting means come out of the process liquid before the semiconductor wafers, when the supporting means is drawn up, wherein the supporting means consists of lower support stands for supporting the lower portions of the wafers, a frame body capable of supporting the lower support stands, and an upper support bar slidably connected to the frame body for holding the upper portions of the wafers, wherein the dust protection means consists of dust protecting plates mounted on the bottom of the frame body.

* * * * *